(12) United States Patent
Blanquart et al.

(10) Patent No.: US 12,635,483 B2
(45) Date of Patent: May 19, 2026

(54) METHOD AND SYSTEM FOR FORMING MATERIAL WITHIN A GAP USING MELTABLE MATERIAL

(71) Applicant: ASM IP Holding B.V., Almere (NL)

(72) Inventors: Timothee Blanquart, Oud-Heverlee (BE); René Henricus Jozef Vervuurt, Leuven (BE); Jan Deckers, Leuven (BE)

(73) Assignee: ASM IP Holding B.V., Almere (NL)

( * ) Notice: Subject to any disclaimer, the term of this patent is extended or adjusted under 35 U.S.C. 154(b) by 628 days.

(21) Appl. No.: 17/953,566

(22) Filed: Sep. 27, 2022

(65) Prior Publication Data

US 2023/0096062 A1     Mar. 30, 2023

Related U.S. Application Data

(60) Provisional application No. 63/250,309, filed on Sep. 30, 2021.

(51) Int. Cl.
H10P 95/00 (2026.01)
H10P 90/00 (2026.01)

(52) U.S. Cl.
CPC .............. H10P 95/00 (2026.01); H10P 90/12 (2026.01)

(58) Field of Classification Search
CPC ......... H01L 21/47635; H01L 21/02008; H01L 21/28556; H01L 21/28562; H01L 21/76882; H01L 23/53209; H01L 21/02175; H01L 21/0223; H01L 21/02247; H01L 21/02318; H01L 21/02532; H01L 21/02565; H01L 21/02612; H01L 21/02664; H01L 21/283; H01L 21/3205; H01L 21/76837; H01L 21/76843; H01L 21/76886; C23C 16/45553; C23C 16/56; C23C 16/407
See application file for complete search history.

(56) References Cited

U.S. PATENT DOCUMENTS

| | | | | |
|---|---|---|---|---|
| 4,026,742 A * | 5/1977 | Fujino | ................... | H01L 23/485 |
| | | | | 438/720 |
| 5,011,793 A * | 4/1991 | Obinata | ............ | H01L 21/76882 |
| | | | | 257/E21.585 |
| 6,057,228 A * | 5/2000 | Lee | ................... | H01L 21/76838 |
| | | | | 438/734 |
| 6,376,369 B1 * | 4/2002 | Doan | ................ | H01L 21/76882 |
| | | | | 438/653 |
| 10,460,932 B2 | 10/2019 | Van Aerde et al. | | |

(Continued)

OTHER PUBLICATIONS

Ahn, D., Park, SH. Cuprous halides semiconductors as a new means for highly efficient light-emitting diodes. Sci Rep 6, 20718 (2016). https://doi.org/10.1038/srep20718 (Year: 2016).*

(Continued)

*Primary Examiner* — William B Partridge
*Assistant Examiner* — Ilker Ozden
(74) *Attorney, Agent, or Firm* — Snell & Wilmer L.L.P.

(57) ABSTRACT

A method and system for forming material within a gap on a surface of a substrate using metal material are disclosed. An exemplary method includes forming a layer of meltable material overlying the substrate and heating the meltable material to a flow temperature to form molten material that flows within the gap.

20 Claims, 9 Drawing Sheets

(56)     References Cited

U.S. PATENT DOCUMENTS

| 2007/0082457 | A1* | 4/2007 | Chou | H01L 21/7684 |
| | | | | 257/E21.583 |
| 2017/0170062 | A1* | 6/2017 | Murray | H01L 21/76847 |
| 2018/0090446 | A1* | 3/2018 | Kawasaki | H01L 21/7684 |
| 2018/0174965 | A1* | 6/2018 | Kamineni | H01L 21/76883 |
| 2021/0327749 | A1* | 10/2021 | Chen | H01L 21/76224 |

OTHER PUBLICATIONS

Zhou et al., Evaporation and decomposition of eutectics of cupric chloride and sodium chloride. J Therm Anal Calorim 129, 1445-1452 (2017). https://doi.org/10.1007/s10973-017-6360-y (Year: 2017).*

D'Almeida et al., Crystallisation of selenium thin films doped with iodine after evaporation. Journal of Materials Science 35, 2985-2991 (2000). https://doi.org/10.1023/A:1004730811005 (Year: 2000).*

Voss et al, Selenium-iodide: A low melting point eutectic semiconductor, Appl. Phys. Lett. 113, 242103 (2018), https://doi.org/10.1063/1.5060269 (Year: 2018).*

* cited by examiner

200

DEPOSIT CONVERTIBLE MATERIAL — 202

HALOGENATION / OXYHALOGENATION — 204

METHOD AND SYSTEM FOR FORMING MATERIAL WITHIN A GAP USING MELTABLE MATERIAL

CROSS-REFERENCE TO RELATED APPLICATIONS

This application claims priority to U.S. Provisional Patent Application Ser. No. 63/250,309, filed Sep. 30, 2021, 2021, and titled METHOD AND SYSTEM FOR FORMING A MATERIAL WITHIN A GAP USING MELTABLE MATE-RIAL, the disclosure of which is hereby incorporated by reference in its entirety.

FIELD OF DISCLOSURE

The present disclosure generally relates to methods and systems used in the formation of electronic devices. More particularly, the disclosure relates to methods and systems suitable for at least partially filling gaps on a surface of a substrate during the manufacture of devices.

BACKGROUND OF THE DISCLOSURE

The scaling of semiconductor devices has led to signifi-cant improvements in speed and density of integrated cir-cuits. However, conventional device scaling techniques face challenges for future technology nodes. In particular, with miniaturization of device features, void-free filling of high aspect ratio gaps (e.g., having an aspect ratio of three or higher) with material becomes increasingly challenging due to limitations of existing deposition processes.

While some techniques have been developed to provide material within a gap, such methods may not provide desired material within the gap in a seamless and/or void-free manner. Accordingly, improved methods and systems for forming material within a gap, while mitigating void and/or seam formation within the material, are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to necessarily limit the scope of the claimed subject matter.

Various embodiments of the present disclosure relate to methods and systems for providing material within a gap—e.g., at least partially filling the gap with desired material. As set forth in more detail below, exemplary methods include forming a layer of meltable material on a surface of a substrate and heating the layer of meltable material to a flow temperature that is higher than a melting temperature of the meltable material.

Exemplary methods of forming material within a gap on a surface of a substrate include the steps of providing the substrate within a reaction chamber of a reactor, forming a layer of meltable material (comprising meltable material) overlying the substrate, heating the meltable material to a flow temperature to form molten material, and cooling the molten material to below the melting temperature to form fill material within the gap. In accordance with examples of these embodiments, the flow temperature is higher than the melting temperature of the meltable material. In accordance with further aspects, the step of forming the layer of melt-able material comprises a cyclical deposition process. In accordance with further aspects, the step of forming the layer of meltable material comprises a conformal deposition process. In accordance with further examples, the step of forming the layer of meltable material comprises forming a convertible material layer on a surface of the substrate and exposing the convertible material layer to a halogen and/or oxyhalogen reactant to thereby form halogenated and/or oxyhalogenated material on the surface. In accordance with further examples, the step of forming the layer of meltable material comprises depositing one or more metal layers. One or more of the metal layers can be or include a metal or a metal mixture (e.g., an alloy or a laminate) composition near a eutectic point composition. A composition of the layer of meltable material can depend on various factors, including the surface material within the gap. In some cases, the surface material can be or include a dielectric material, and the layer of meltable material can be or include a dielectric material. In accordance with additional cases, the surface material can be or include a metal or semiconductor mate-rial, and the layer of meltable material can be or include a metal. In yet additional cases, the surface material can be or include a dielectric material, a semiconductor, and/or a metal, and the layer of meltable material can be or include a semiconductor. Various examples of surface materials and meltable materials are provided in the following section.

In accordance with further examples of the disclosure, a structure is provided. The structure includes a substrate including a gap and material (e.g., meltable, converted, fill, and/or treated material) formed within the gap. The material can include material formed according to a method as described herein.

These and other embodiments will become readily appar-ent to those skilled in the art from the following detailed description of certain embodiments having reference to the attached figures. The invention is not limited to any particu-lar embodiments disclosed.

BRIEF DESCRIPTION OF THE DRAWING FIGURES

A more complete understanding of the embodiments of the present disclosure may be derived by referring to the detailed description and claims when considered in connec-tion with the following illustrative figures.

Figure 1:
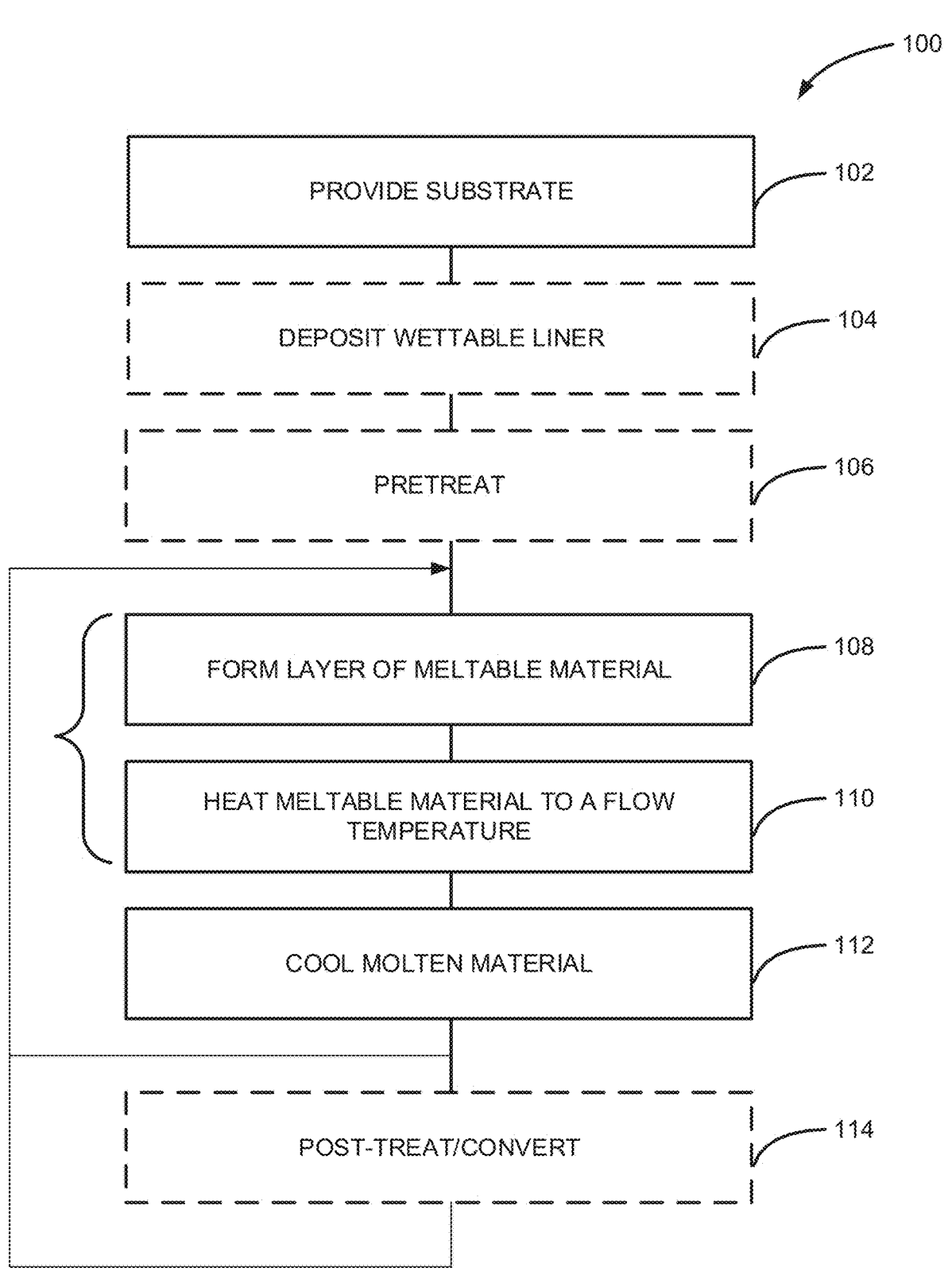
FIG. 1 illustrates a method in accordance with examples of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods and structures provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as examples. Unless otherwise noted, the exemplary embodiments or components thereof may be combined or may be applied separate from each other.

The present disclosure provides improved methods and systems for at least partially filling a gap with material. As set forth in more detail below, methods and systems described herein can be used to fill the gap with desired material in a void-free and/or seamless manner—e.g., from the bottom up.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas. Exemplary seal gases include noble gases, nitrogen, and the like. In some cases, the term "precursor" can refer to a compound that participates in the chemical reaction that produces another compound, and particularly to a compound that constitutes a film matrix or a main skeleton of a film; the term "reactant" can be used interchangeably with the term precursor. In some cases, a reactant reacts with a precursor or derivative thereof to form a film or layer.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. In some cases, a substrate can include a wettable liner as described herein.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may comprise, or may consist at least partially of, a plurality of dispersed atoms on a surface of a substrate. A film or layer may comprise material or a layer with pinholes and/or isolated islands. A film or layer may be at least partially continuous.

As used herein, a "structure" can be or can include a substrate as described herein. Structures can include one or more layers overlying the substrate, such as one or more layers formed according to a method as described herein.

The term "deposition process," as used herein, can refer to the introduction of precursors, reactants, and/or other gases or reactive species into a reaction chamber to deposit or form a layer over a substrate. "Cyclical deposition processes" and non-cyclical deposition processes (e.g., chemical vapor deposition (CVD) and physical vapor deposition (PVD)) are examples of deposition processes.

The term "cyclic deposition process" or "cyclical deposition process" can refer to the sequential provision of precursors, reactants, and/or a plasma power to deposit a layer over a substrate and includes processing techniques, such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

As used herein, the term "purge" may refer to a procedure in which an inert or substantially inert gas (which can include a non-activated reactant in some cases) is provided to a reaction chamber in between two pulses of gases that react with each other. For example, a purge, e.g., using a noble gas, may be provided between a precursor pulse and a reactant pulse, thus avoiding or at least reducing gas phase interactions between the precursor and the reactant. It shall be understood that a purge can be effected either in time or in space, or both. For example, in the case of temporal purges, a purge step can be used, e.g., in the temporal sequence of providing a first precursor to a reaction chamber, providing a purge gas to the reaction chamber, and providing a reactant to the reaction chamber, wherein the substrate on which a layer is deposited does not move. For example, in the case of spatial purges, a purge step can take the following form: moving a substrate from a first location to which a first precursor is continually supplied, through a purge gas curtain, to a second location to which a reactant is continually supplied.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like.

As used herein, the term "comprising" indicates that certain features are included, but that it does not exclude the presence of other features, as long as they do not render the claim or embodiment unworkable. In some embodiments, the term "comprising" includes "consisting of" or "consisting essentially of." As used herein, the term "consisting of" indicates that no further features are present in the apparatus/method/product apart from the ones following said wording. When the term "consisting of" is used, referring to a chemical compound, it indicates that the chemical compound only contains the components which are listed.

In this disclosure, the term "filling capability" refers to a capability of filling a gap substantially without voids (e.g., no void having a size of approximately 5 nm or greater in diameter) and seams (e.g., no seam having a length of approximately 5 nm or greater), wherein seamless/void-less bottom-up growth of a layer is observed. An effective growth of material at a bottom of a gap may be at least approximately 1.5 times faster than growth on sidewalls of the gap and on a top surface having the gap. This disclosure provides methods and systems for forming fill material with filling capability, i.e., methods and systems for filling gap from the bottom up.

In this disclosure, a recess between adjacent protruding structures and any other recess pattern may be referred to as a "gap." That is, a gap may refer to any recess pattern, including a hole/via, region between lines, and the like. A gap can have, in some embodiments, a width of about 20 nm to about 100 nm, and typically about 30 nm to about 50 nm. When a trench has a length that is substantially the same as its width, it can be referred to as a hole or a via. Holes or vias typically have a width of about 20 nm to about 100 nm. In some embodiments, a trench has a depth of about 30 nm to about 100 nm, and typically of about 40 nm to about 60 nm. In some embodiments, a gap has an aspect ratio of about 2 to about 10, and typically of about 2 to about 5. The dimensions of the gap may vary depending on process conditions, film composition, intended application, and the like.

As used herein, the term "height" may refer to the extent of a gap in a plane perpendicular to the surface of the substrate that comprises the gap in question.

As used herein, the term "width" may refer to the extent of a gap in a direction in a plane parallel to the surface of the substrate that comprises the gap in question.

As used herein, the term "length" may refer to the extent of a gap in a direction in a plane parallel to the surface of the substrate that comprises the gap in question. The directions in which the "width" and the "length" are measured are generally mutually perpendicular. It shall be understood that all dimensions, including length, width, and height of a structure, can be measured using routine techniques, such as scanning transmission electron microscopy (STEM).

Exemplary gaps include recesses, contact holes, vias, trenches, and the like. A gap generally comprises a distal part and a proximal part. The distal part comprises a distal surface. The proximal part comprises a proximal surface. It shall be understood that the gap does not necessarily have to be oriented vertically, but can extend in a horizontal direction. It shall be understood that the proximal part of the gap is the part of the gap that is closest to the substrate surface in which the gap forms a recess, and the distal part of the gap is the part of the gap that is most distant from that surface. A gap can include one or more sidewalls between the distal surface and the proximal surface.

In this disclosure, any defined meanings do not necessarily exclude ordinary and customary meanings in some embodiments.

Turning now to the figures, FIG. 1 illustrates a method 100 in accordance with examples of the disclosure. FIGS. 4-9 illustrate exemplary structures formed using method 100. Method 100 can be used for form fill material within gap in a void-free and/or seamless manner.

As illustrated, method 100 includes the step of providing a substrate (step 102), optionally depositing a wettable liner (step 104), optionally pretreating a surface (step 106), forming a layer of meltable material (step 108), heating the meltable material to a flow temperature (step 110), cooling molten material (step 112), and optionally post treating or converting (step 114). Although separately illustrated, various steps of method 100 can be combined or can overlap. For example, steps 108 and 110 can overlap in some cases. As used herein, overlap means performed within the same reaction chamber for a period of time.

As described in more detail below, various steps of method 100 can be performed within a gas-phase reactor system—e.g., within a single reactor system. For example, two or more steps of method 100 can be performed in one or more reaction chambers of a single reactor system or cluster tool or process module.

During step 102, a substrate comprising a gap is provided, e.g., into a reaction chamber of a reactor system. The substrate can include a gap and a surface material within the gap. In accordance with examples of the disclosure, the reaction chamber can form part of a gas-phase reactor, such as a (e.g., plasma-enhanced) cyclical deposition reactor, such as a plasma-enhanced atomic layer deposition (PEALD) reactor, an atomic layer deposition (ALD) reactor, a chemical vapor deposition (CVD) reactor, a plasma-enhanced chemical vapor deposition (PECVD) reactor, a pulsed PECVD reactor, a physical vapor deposition (PVD) reactor, or the like. A type of reactor can depend on a subsequent step of method 100, such as a material deposited during step 108. A reactor can be provided with a heater and/or plasma apparatus to activate reactions within the reaction chamber.

During step 102, the substrate can be brought to a desired temperature and pressure for a subsequent step—e.g., step 104, 106 and/or 108. While the specific temperatures and pressures can depend on the subsequent step and/or material deposited, by way of examples, a temperature (e.g., of a substrate or a substrate support) within a reaction chamber can be between about 50° C. and about 700° C. or about 100° C. and about 700° C.; a pressure within the reaction chamber can be about 1 to about 20 or about 20 to about 100 Pa.

During optional step 104, a wettable liner can be formed within at least a portion of the gap. The wettable liner may be desirable in cases in which material deposited during step 108 does not wet the surface material within the gap to a desirable extent. The wettable liner can be deposited using any suitable deposition process, such as a cyclical deposition process.

The wettable liner can be a metal, a semiconductor, or a dielectric material (e.g., a (e.g., metal, such as a transition metal) carbide, boride, nitride, or the like). As used herein, the term metal refers to conductive material (e.g., material with no bandgap between a conduction band and a valence band); the term semiconductor refers to material with a bandgap greater than zero to about 4 eV, or from about 0.2 eV to about 3 eV, or from about 0.5 eV to about 2 eV, or from about 0.1 eV to about 1 eV. The term dielectric material can be used interchangeably with insulating material and can refer to materials with a bandgap greater than about 4 eV. A metal need not be elemental metal; a metal can also be, for example, a metal binary or higher order compound that exhibits a metallic band structure. For example, a metal can be an elemental metal, an alloy, or a metallic compound, such as titanium nitride. Similarly, a semiconductor can be an elemental semiconductor or a binary or higher order compound, with semiconductive properties, such as silicon carbide, copper oxide, molybdenum oxide, indium oxide, tin oxide, and the like.

In some cases, when the layer of meltable material comprises a metal, the wettable liner can comprise a metal or a semiconductor. In some cases, when the layer of meltable material comprises a dielectric material, the wettable liner can comprise a dielectric material. For example, a metal oxyhalide can wet a metal oxide. In some cases, the wettable layer can be a metal, a semiconductor, or a dielectric material, and the layer of meltable material comprises a semiconductor material. Alternatively, the surface material within the gap can include any of the wettable liner materials noted above, in which cases, step 104 may not be employed. In some cases, the meltable material has a melting temperature between 20° C. and 500° C., between 50° C. and 400° C., or between 75° C. and 350° C., or between 20° C. and 50° C., 50° C. and 100° C., 100° C. and 200° C., or 200° C. and 500° C.

Figure 9:
Figure 9:
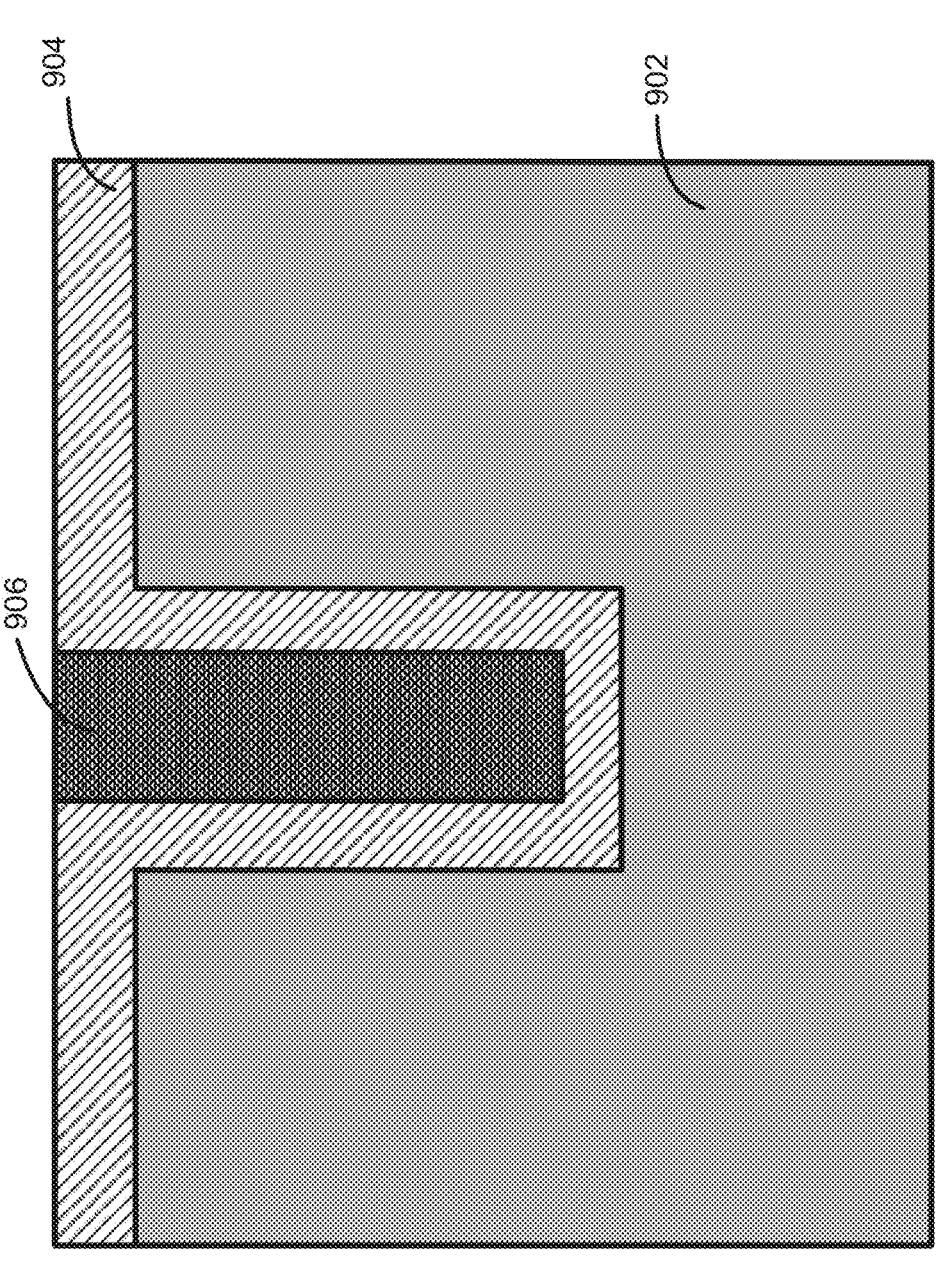

FIG. 9 illustrates a structure 900, including substrate 902, a wettable liner 904, and layer of meltable material (or fill material) 906 overlying wettable liner 904. Generally, whether a wettable liner is used or not, good wetting between a surface (e.g., the surface material within the gap or wettable liner surface) and subsequently deposited layer of meltable material is desired. In this context, good wetting can mean a contact angle between the molten material and the surface is less than 30, 20, 10, or 5 degrees. In the case of layer of meltable material comprising a metal or a metal mixture, discussed in more detail below, good wetting of a liquid (melted) metal on a solid substrate can be observed if the adhesion energy is close (e.g., within 50% or 40% or 30% or 20% or 10% or 5% or 2% or 1%) to the cohesion energy of the liquid 2σLV.

During step 106, an optional pretreatment step is performed. Step 106 can be performed in lieu of or in addition to step 104. Step 106 can include a thermal or a (e.g., direct, indirect, or remote) plasma process. For example, step 106 can include a plasma nitriding or carbonizing process that includes providing a nitrogen-containing gas and/or a carbon-containing gas and forming excited species from such gas(es). In some cases, a non-directional process, such as a remote plasma process, may be desired, such that sidewalls, as well as distal and proximal surfaces, are treated.

Exemplary nitrogen-containing gases include $N_2$, $NH_3$, $N_2H_4$, and mixtures of $N_2$ and $H_2$. Exemplary carbon-containing gases include alkanes such as $CH_4$ and $C_2H_4$.

During step 108, a layer of meltable material is formed overlying the substrate. Generally, a meltable material may desirably have a melting temperature below 700° C. or 500° C. or 400° C. or 300° C. or 200° C. Additionally or alternatively, the meltable material may have a melting temperature greater than 25° C. or 100° C. In accordance with examples of the disclosure, the step of forming the layer of meltable material comprises a cyclical deposition process, such as ALD, PEALD, cyclical CVD, or the like. In accordance with further examples, the step of forming the layer of meltable material comprises one or more conformal deposition processes. However, unless otherwise noted, embodiments of the disclosure are not so limited. Any suitable deposition process can be used for step 108, including, for example, PVD.

A composition of the layer of meltable material can depend on a variety of factors, including a surface of the underlying material—e.g., the surface material within the gap, including any treatment thereof and/or any wettable liner, including any treatment thereof. Exemplary meltable materials include, for example, metal, metal mixtures, a metal halide, and/or a metal oxyhalide. As used in this context, a metal halide includes at least one metal element and at least one halogen element; a metal oxyhalide includes at least one metal, at least one halogen, and oxygen. In accordance with examples of the disclosure, the meltable material is not polymeric material. While not meant to be limiting, specific exemplary material suitable for the layer of meltable material includes a metal halide or metal oxyhalide, such as one or more metal halides or oxyhalides, including one or more of Zn, Ir, Pt, Mo, Ta, Nb, Sn, Se, Bi, Cd, and Pb. Specific examples include $ZnF_2$, $ZnCl_2$, $ZnBr_2$, $ZnI_2$, $IrF_6$, $IrF_5$, $IrF_4$, $PtF_6$, $PtF5$, $PtF_4$, $MoF_5$, $MoF_6$, $TaF_5$, $TaCl_5$, $NbF_5$, $NbCl_5$, $SnF_2$, $SnCl_2$, $SnBr_2$, $SnI_2$, $SeOBr^2$, and $SeOCl_2$. Exemplary metals include Sn, SeBi, Cd, Pb, and exemplary metal mixtures include Sn—Au—Cu mixtures Al—Cu mixtures, and mixture comprising two or more or tin, copper, silver, bismuth, indium, zinc, and antimony; for example Sn—Cu mixtures, Sn—Ag mixtures, Sn—Bi mixtures, Sn—In mixtures, Sn—Zn mixtures, Sn—Sb mixtures, Cu—Ag mixtures, Cu—Bi mixtures, Cu-in mixtures, Cu—Zn mixtures, Cu—Sb mixtures, Ag—Bi mixtures, Ag—In mixtures, Ag—Zn mixtures, Ag—Sb mixtures, Bi—In mixtures, Bi—Zn mixtures, Bi—Sb mixtures, In—Zn mixtures, In—Sb mixtures, Zn—Sb mixtures, Sn—Cu—Ag mixtures, Sn—Cu—Bi mixtures, Sn—Cu—In mixtures, Sn—Cu—Zn mixtures, Sn—Cu—Sb mixtures, Sn—Ag—Bi mixtures, Sn—Ag—In mixtures, Sn—Ag—Zn mixtures, Sn—Ag—Sb mixtures, Sn—Bi—In mixtures, Sn—Bi—Zn mixtures, Sn—Bi—Sb mixtures, Sn—Zn—Sb mixtures, Ag—Bi—In mixtures, Ag—Bi—Zn mixtures, Ag—Bi—Zn mixtures, Ag—Bi—Sb mixtures, Ag—In—Zn mixtures, Ag—In—Sb mixtures, Ag—Zn—Sb mixtures, Bi—In—Zn mixtures, Bi—In—Sb mixtures, or In—Zn—Sb mixtures. Exemplary mixtures of dielectrics include $Al_2O_3$—$Na_3AlF_6$ mixtures. It shall be understood that these mixtures can either comprise or consist of or substantially consist of (consist essentially of) the aforementioned elements.

In some cases, the layer of meltable material can be directly deposited using a deposition process. For example, various (e.g., metal) halides, metals, alloys, semiconductors, and the like can be directly deposited. By way of particular examples, a metal, metal oxide, metal nitride, or the like can be formed during step 108. Such materials can be deposited using any suitable technique, such as ALD, CVD, PVD, or the like.

In other cases, step 108 can include two or more process steps. Exemplary processes suitable for step 108 are discussed in more detail below in connection with FIGS. 2 and 3.

Once step 108 is complete, or in some cases, during step 108, the layer of meltable material is heated to a flow temperature that is higher than a melting temperature of the layer of meltable material to form molten material during step 110. For example, the layer of meltable material can be heated to a temperature of about 1, 2, 5, 10, 15, 20, or 25° C. above the melting point of meltable material. Additionally or alternatively, the layer of meltable material can be heated to 0.2, 0.5, or 1% above the melting temperature of the layer of meltable material.

In accordance with examples of the disclosure, step 110 includes performing a rapid thermal anneal (RTA) or a flash anneal step. The RTA/flash anneal step can include exposing the substrate to infrared radiation for a brief time period (e.g., from at least 30 seconds to at most 5 minutes). During an RTA, a substrate's surface can be heated to, e.g., a temperature from at least 200° C. to at most 700° C. In accordance with additional examples, a substrate can be heated—e.g., using a susceptor heater and/or as a soak heat treatment process. In these cases, the substrate can be heated to a temperature of least 100° C. to at most 400° C. for a period of about 5 minutes to about 30 minutes. The heat treatment can be performed in an atmosphere comprising one or more of a noble gas, an oxygen-containing gas, a nitrogen-containing gas, a carbon-containing gas, and a hydrogen-containing gas. Additionally or alternatively, step 110 can include a spike anneal laser process with a duration of about 1 to about 30 seconds. Exemplary oxygen-containing gases include $O_2$, $O_3$ $H_2O$, exemplary nitrogen-containing gases include $N_2NH_3$, and $N_2H_2$, exemplary carbon-containing gases include $CH_4$, and exemplary hydrogen-containing gases include $H_2$.

During step 110, the molten material flows to at least partially fill the gap. Once step 110 is complete, step 112 of cooling the molten material to below the melting temperature to form fill material within the gap is performed. Step 112 can include simply removing the substrate from a reaction space or the reactor system. In some cases, step 112 can include controlling a ramp down temperature of the substrate—e.g., at a rate between about 1° C./min to about 100° C./minute.

In some cases, the fill material can be treated and/or converted to another material during step 114. Step 114 can include, for example, providing a post-treatment and/or converting reactant, which can include or be used to produce thermally and/or plasma activated species. For example, step 114 can include a thermal excitation, remote plasma excitation, indirect plasma excitation, and/or direct plasma excitation to form activated species using a post-treatment reactant.

When used, step 114 can include converting fill material to another material, which may have a higher melting temperature and/or include desired properties, such as insulating properties, conductivity, etch resistance, or the like.

Specific process conditions during step 114 can vary depending on, for example, a composition of the meltable material. By way of examples, a temperature (e.g., of a substrate or a substrate support) within a reaction chamber can be between about 25° C. and about 100° C. or about 100° C. and about 300° C.; a pressure within the reaction chamber can be about 1 to about 20 or about 20 to about 100 Torr during step 108.

A converting/post-treatment reactant can comprise one or more of a noble gas, such as helium or argon; an oxidizing reactant; a nitriding reactant; a carbon-containing reactant; and a reducing reactant. By way of examples, the oxidizing reactant can comprise an oxygen-containing gas, such as oxygen ($O_2$), $O_3$, $H_2O$, or the like; the nitriding reactant can comprise a nitrogen-containing gas, such as nitrogen ($N_2$), ammonia, hydrazine, (e.g., alkyl) substituted hydrazine, forming gas, or the like; the carbon-containing reactant can include, for example, $CH_4$ or the like; the reducing reactant can include, for example, a hydrogen-containing gas, such as $H_2$ or the like. Any of the oxidizing reactant, nitriding reactant, carbon-containing reactant, and a reducing reactant can include or be used to form excited species.

As illustrated in FIG. 1, and as discussed below, various steps of method 100 can be repeated prior to proceeding to the next step. For example, steps 108-112 or steps 108-114 can be repeated a number of times to form a desired amount of fill material within the gap.

Figure 2:
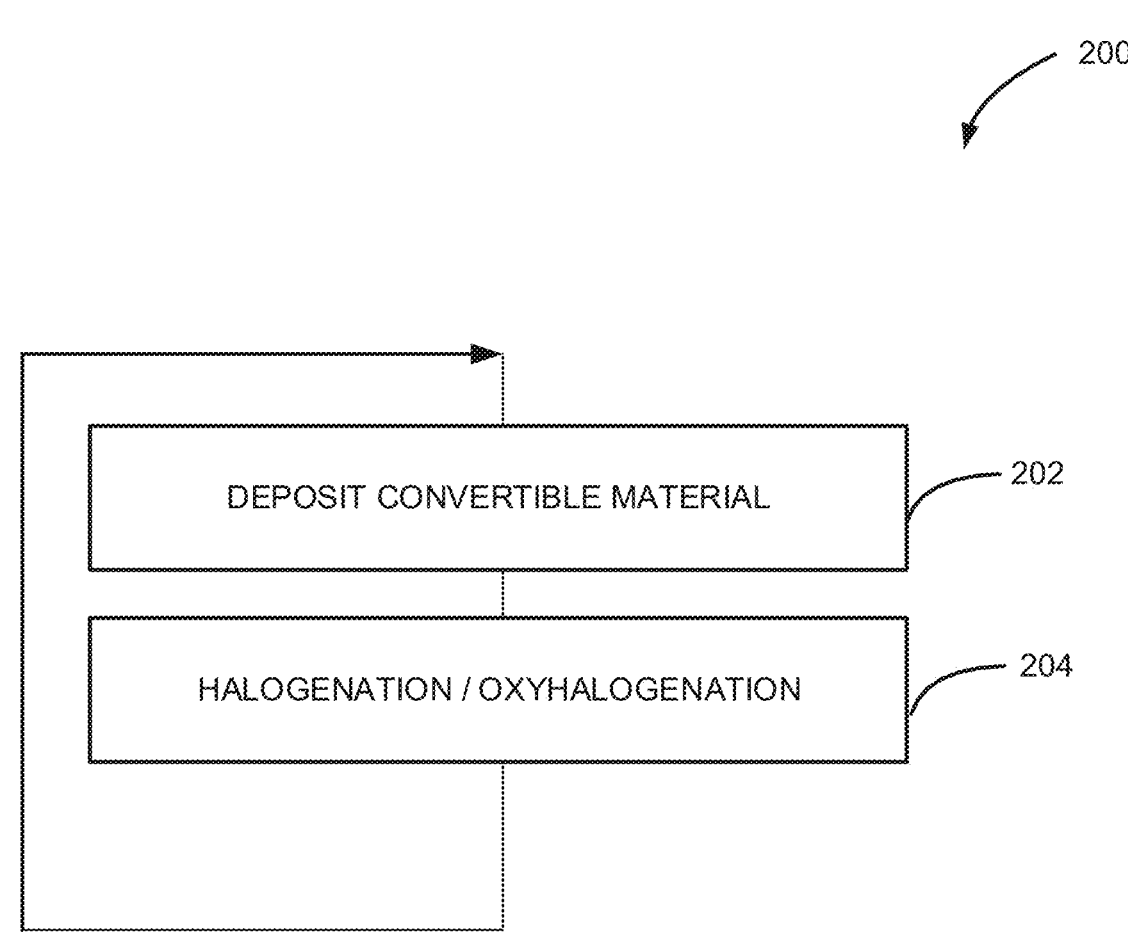
FIG. 2 illustrates an exemplary process to form a layer of meltable material in accordance with examples of the dis-closure.

Turning now to FIG. 2, an exemplary process 200, suitable for use as step 108 in method 100, is illustrated. FIGS. 4-7 illustrate structures formed using method 100 and process 200 and corresponding steps of method 100 and process 200.

In the illustrated example, process 200 includes a step of forming a convertible material 202 and a halidination/oxyhalidination step 204 to form the meltable material. As noted in more detail below, in some cases, step 204 and step 110 can overlap.

Figure 4:
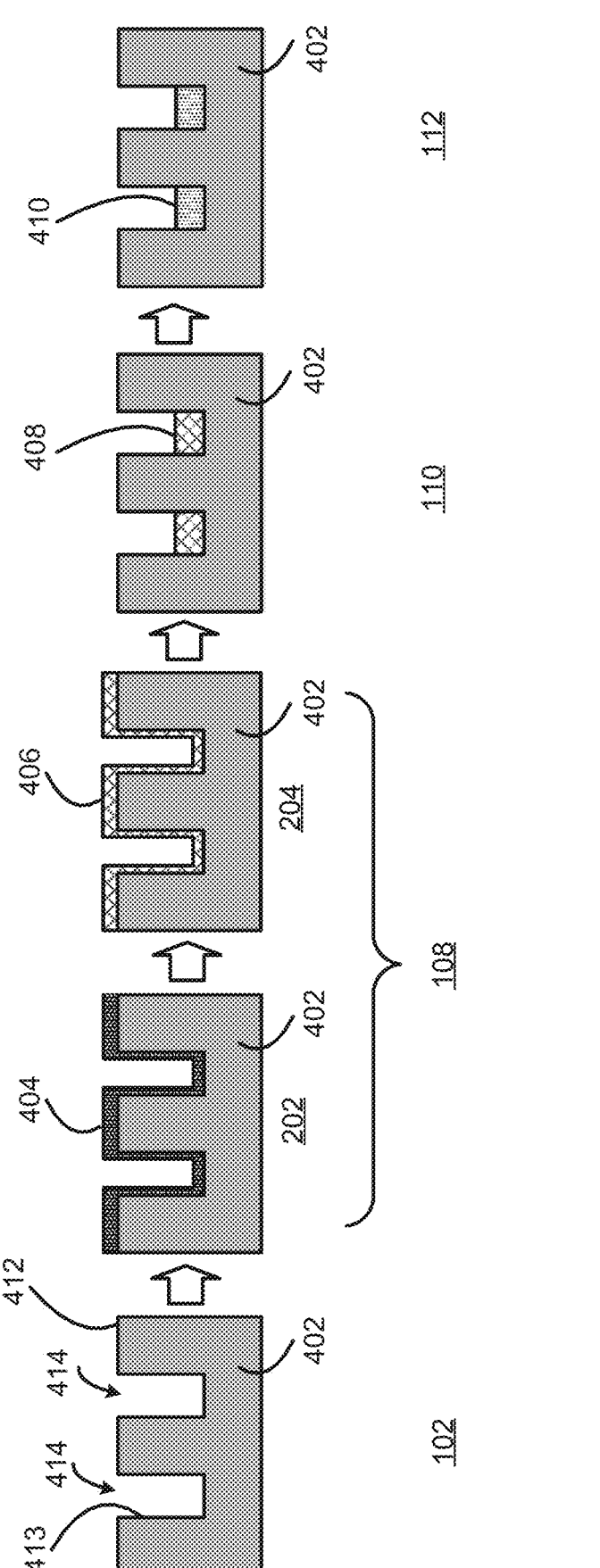
FIGS. 4-9 illustrate structures formed in accordance with examples of the disclosure.

During step 202, a convertible material layer is formed on a surface of the substrate. As illustrated in FIG. 4, a convertible material layer 404 can be deposited onto a substrate 402, which includes gaps 414 and a surface 412, including surface material within gaps 414.

Convertible material layer 404 can be, for example, one or more of a metal (such as an elemental metal, a metal mixture, an alloy, or a compound material), a dielectric material (such as a metal oxide), or a semiconductor (such as an elemental semiconductor or a compound semiconductor). A compound semiconductor can be an alloy of two elemental semiconductors, such as SiGe. Alternatively, a compound semiconductor can be a chalcogenide, such as an oxide: CuO, $CuO_2$, InO, or SnO. Or, a compound semiconductor can be a multi-component material, such as indium gallium zinc oxide. Other exemplary compound semiconductor materials are provided elsewhere herein. By way of examples, convertible material layer 404 can be or include a metal-containing layer, such as a metal, metal oxide, a metal oxynitride, a metal nitride, or a metal carbide. A suitable metal-containing layer can be represented by $MZ_x$, where M is a metal, such as a transition metal, or a post transition metal, where Z is one or more of C, O, and N, and where x ranges from 0 to about 3. In some cases, the metal-containing layer can include an oxynitride. A suitable metal oxynitride can be represented by $MO_xN_y$, where M is a metal, such as a transition metal or a post transition metal, where x ranges from about 0.5 to about 3, and y ranges from about 0.5 to about 3. Particular examples include titanium oxide, tin oxide, zinc oxide, TaC, and $Ta_2O_5$.

Convertible material layer 404 can be deposited using any suitable method. In some cases, convertible material layer 404 is conformally deposited—e.g., using a cyclical process, such as ALD or PEALD. In some embodiments, the convertible material layer exhibits a step coverage equal to or greater than 50%, or greater than 80%, or greater than 90%, or greater than 100%, or greater than 110%, or greater than 150%, or greater than 200%, in/on structures having aspect ratios (height/width) of more than about 2, more than about 5, more than about 10, more than about 25, more than about 50, more than about 100, or between about 10 and 100 or about 5 and about 25. It shall be understood that the term "step coverage" refers to a thickness of a layer on a distal surface of a recess, divided by the thickness of that layer on a proximal surface of the recess, and is expressed as a percentage. It shall be understood that a distal portion of the gap feature refers to a portion of the gap feature that is relatively far removed from a substrate's surface, and that the proximal portion of a gap feature refers to a part of the gap feature which is closer to the substrate's surface compared to the distal/lower/deeper portion of the gap feature.

A convertible material layer having a desired thickness can be deposited by choosing a suitable amount of deposition cycles or a suitable amount of time. For example, and in some embodiments, the presently described methods can comprise depositing a layer having a thickness of at least 0.3 nm to at most 100 nm or more. In some cases, the thickness can range from about 0.3 nm to a critical dimension (e.g., width) of a gap divided by about 2 Thus, a method as described herein may comprise executing a suitable amount of deposition cycles or running for a desired amount of time to obtain a desired material layer thickness.

Once a desired thickness of the convertible material layer is deposited during step 202, convertible material layer 404 is exposed to a halogen reactant and/or an oxyhalogen reactant in step 204 to thereby form a halogenated material and/or an oxyhalogenated material (e.g., the meltable material) 406 on a surface 412 of substrate 402. Specific process conditions during step 204 can vary depending on, for example, the halogen reactant and/or convertible material layer. By way of examples, a temperature (e.g., of a substrate or a substrate support) within a reaction chamber can be between about 50° C. and about 700° C. or about 75° C. and about 500° C.; a pressure within the reaction chamber can be about 1 to about 20 or about 20 to about 100 Torr during step 204. In some cases, the halogen reactant and/or the oxyhalogen reactant comprises activated species. Such activated species can be formed by, for example, providing a halogen-containing gas and/or any oxygen-halogen-containing gas within a plasma apparatus, such as a direct, indirect, and/or remote plasma apparatus.

Exemplary halogenating oxyhalogenating agents/reactants include reactants including one or more of fluorine, chlorine, iodine, and bromine. Specific halogenating oxyhalogenating agents/reactants include $OF_2$, $FClO_2$, and $FClO_3$. Additional exemplary halogen reactants and/or an oxyhalogen reactants suitable for use with exemplary embodiments provided herein are provided in U.S. Pat. No. 10,280,519, entitled Thermal Atomic Layer Etching Processes, the contents of which are hereby incorporated herein by reference, to the extent such contents do not conflict with the present disclosure.

Once the halogenated material and/or oxyhalogenated material are formed (e.g., by repeating steps 202 and/or 204 a number of times), method 100 can proceed to step 110 to heat meltable material 406 to a flow temperature to form molten material that flows within gap 414. The meltable material can then be cooled to form fill material 408. Fill material 408 can be treated as noted above during step 114 to form treated material 410.

Figure 5:
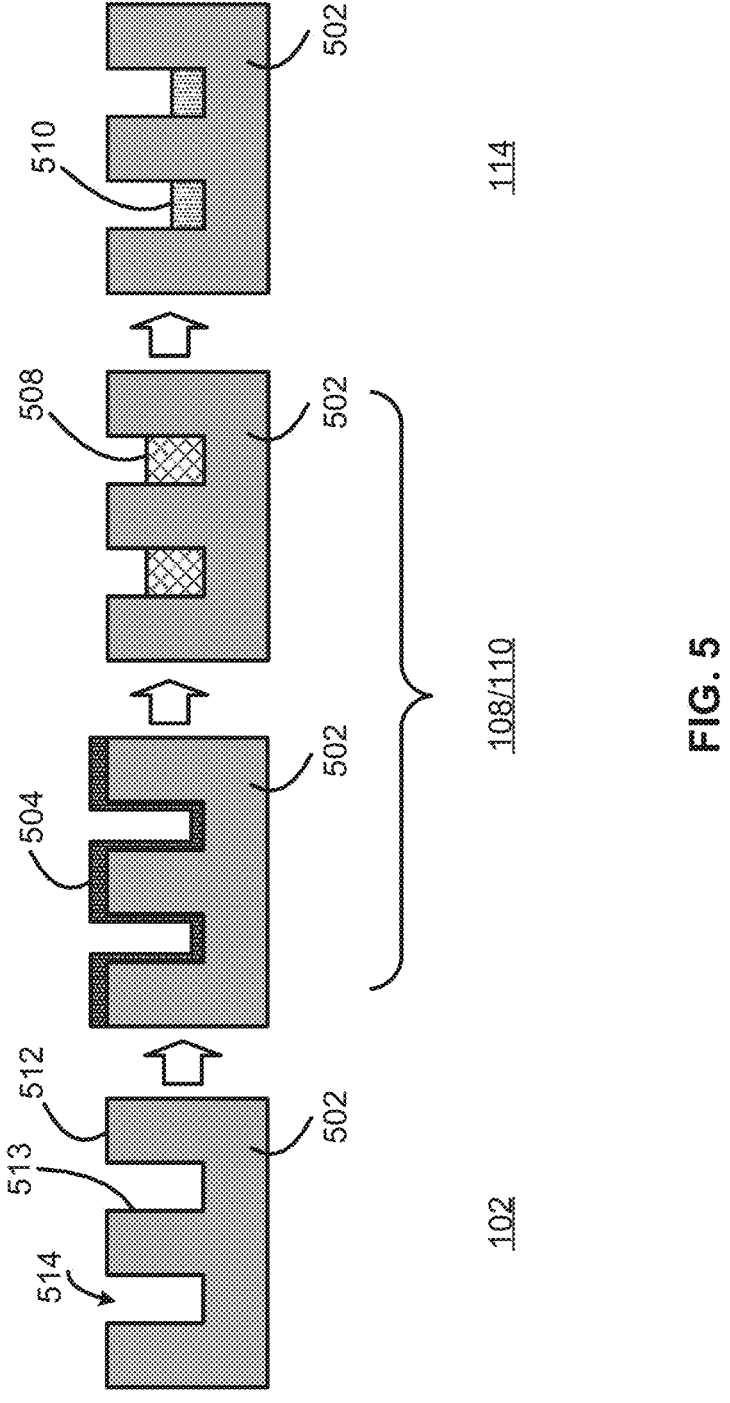

FIG. 5 illustrates a variation of method 100, in which steps 108 and 110 overlap (e.g., are coincident). In this example, a substrate 502, including a surface 512, surface material within the gap 513, and gaps 514, is provided. A convertible material layer 504 is formed on surface 512 (which can include a wettable liner and/or a pretreated surface). Convertible material layer 504 can be formed as described above in connection with step 202.

Once a desired thickness of the convertible material layer 504 is deposited, convertible material layer 504 is exposed to a halogen reactant and/or an oxyhalogen reactant to thereby form a halogenated material and/or an oxyhalogenated material (e.g., the meltable material) 406 on surface 512 of substrate 402. In this case, overlapping steps 108 and 110 can be performed at a temperature above the melting temperature of the layer of meltable material (e.g., at the temperatures noted above in connection with step 110), such that the meltable material flows as it forms molten material.

The meltable material can then be cooled to form fill material 508. Fill material 508 can be treated as noted above during step 114 to form treated material 510.

Figure 6:
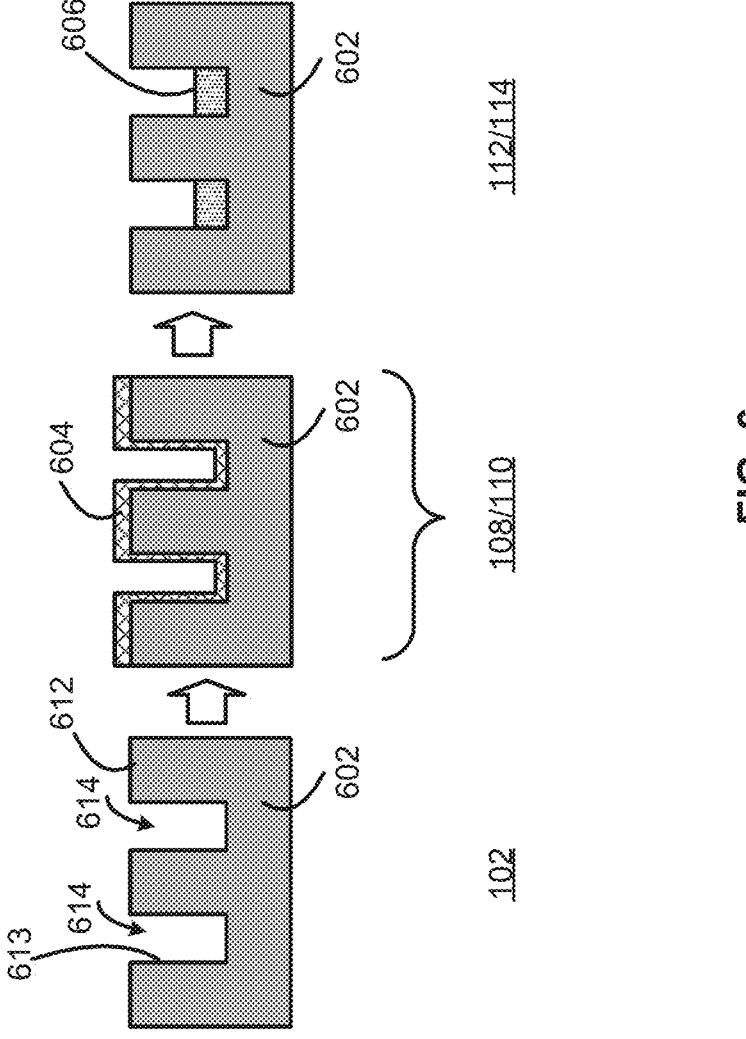

FIG. 6 illustrates an example of method 100, in which layer of meltable material is directly deposited onto a substrate (which can include a wettable liner and/or a pre-treated surface). By way of examples, the method illustrated in FIG. 6 may be particularly suitable for deposition of metal halides and/or metal oxyhalides.

In this example, a substrate 602, including a surface 612, surface material within the gap 613, and gaps 614, is provided. A layer of meltable material 604 is formed overlying surface 612. In this case, steps 108 and 110 of method 100 overlap and can be performed at a temperature higher than a melting temperature of layer of meltable material, such that layer of meltable material 604 can flow as layer of meltable material forms.

The meltable material can then cool and be converted/treated as described herein to form fill material (or treated material) 606. The fill material can optionally be treated as described herein.

Figure 7:
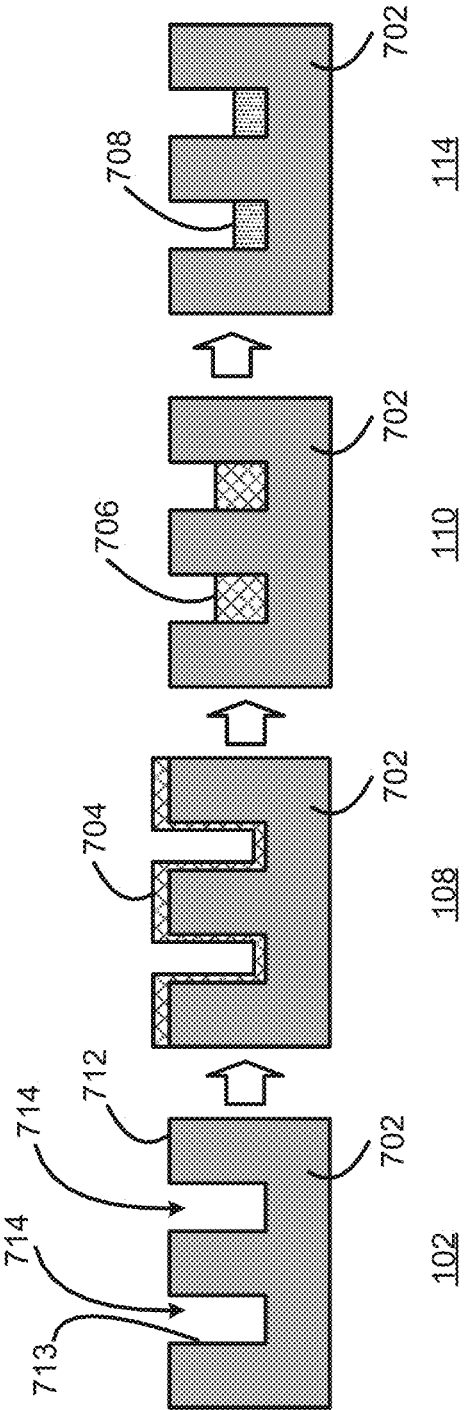

FIG. 7 illustrates an example of method 100, in which a layer of meltable material is directly deposited onto a substrate (which can include a wettable liner and/or a pre-treated surface) at a temperature below the melting temperature of the meltable material. By way of examples, the method illustrated in FIG. 7 may also be particularly suitable for deposition of metal halides and/or metal oxyhalides.

In the example illustrated in FIG. 7, a substrate 700, including a surface 712, surface material within the gap 713, and gaps 714, is provided. A layer of meltable material 704 is formed overlying surface 712 at a temperature below the melting temperature of layer of meltable material 704.

Step 110 can then be performed as described herein to form molten material to flow within gaps 714. The molten material can then be cooled to form fill material 706 within gap 714 to form fill material 706. Fill material 706 can be suitably treated using step 114, as described above, to optionally form converted material 708.

Figure 3:
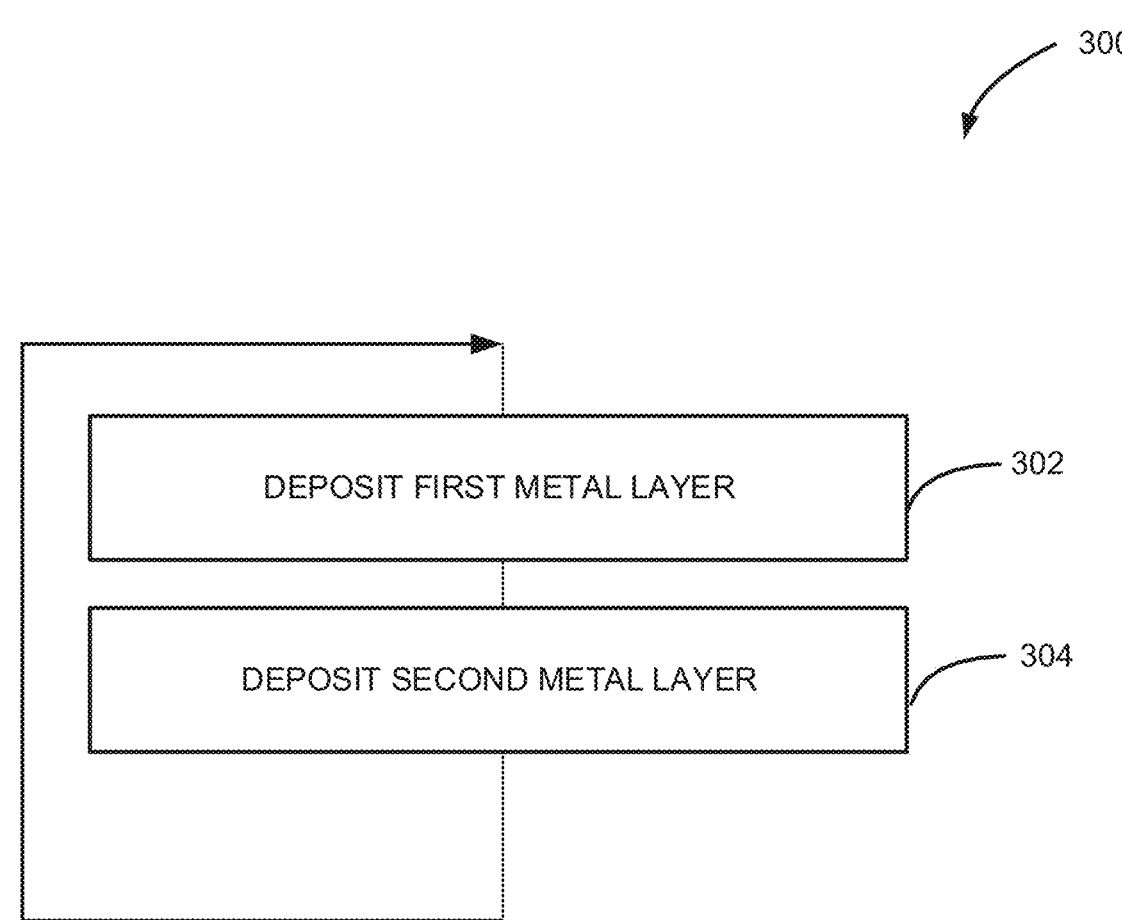
FIG. 3 illustrates another exemplary process to form a layer of meltable material in accordance with examples of the disclosure.

FIG. 3 illustrates another process 300 suitable for use as step 108 of method 100. As noted above, in some cases, the layer of meltable material can include a laminate of a plurality of layers. For example, the laminate can include two or more metal-containing layers, wherein at least one metal in two or more layers differs.

Figure 8:
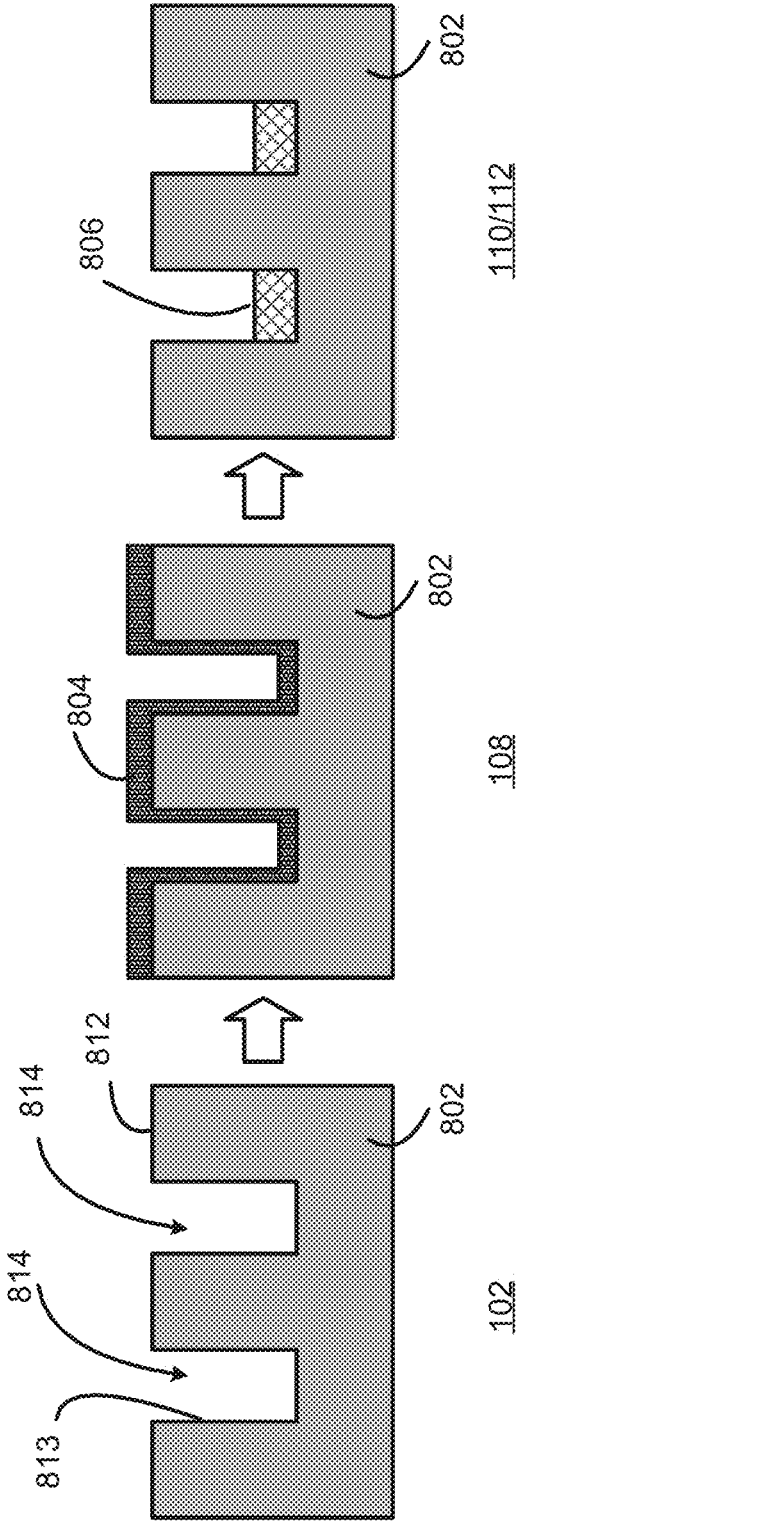

As illustrated, process 300 includes the steps of depositing a first metal layer (step 302) and depositing a second metal layer (step 304). Although illustrated with two deposition steps, process 300 can include additional metal layer deposition steps. Steps 302, 304, and any additional metal layer deposition steps can use any suitable deposition process, such as CVD, ALD, PVD, or the like. A thickness of metal layers formed during step 302 and/or 304 can be, for example, about 1 to about 50 nm. FIG. 8, discussed in more detail below, illustrates structures that can be formed using process 300.

SPECIFIC EXAMPLES

The specific examples below are meant to be illustrative; these examples are not meant to be exhaustive. Unless otherwise noted, embodiments of the disclosure are not limited to such examples.

Example 1: Zn Halogen Meltable Material Using a Convertible Layer

With reference to FIGS. 1, 2, 4, and 5 during step 202, a convertible material layer 404, 504 comprising zinc (e.g., Zn or ZnO) can be formed overlying substrate 402, 502. The depositing can be performed using any suitable technique, such as, for example, for ZnO, diethyl zinc (DEZ) as a precursor and water as a reactant in an ALD deposition process. Zn can be deposited using, for example, a CVD, ALD, or PVD process.

The reactants used during step 204 can include, for example, $I_2$ for use with convertible material comprising Zn to form $ZnI_2$ (melting point temperature 446° C.); HCl and/or $Cl_2$ for use with convertible material comprising Zn and/or ZnO to form $ZnCl_2$ (melting point temperature 290° C.); HBr for use with convertible material comprising Zn and/or ZnO to form $ZnBr_2$ (melting point temperature 394° C.). In accordance with these examples, steps 108 and 110 can be separate or overlap.

Additional exemplary Zn precursors and reactants suitable for forming a layer of meltable material comprising zinc oxide are provided below in Table 1.

TABLE 1

| Precursor | Reactant and process |
|---|---|
| [EtZn(damp)]₂ | $H_2O$ |
| Zn | $H_2O$ |
| Zn | $O_2$ |
| Zn(DMP)₂ | $O_2$ plasma |
| Zn(eeki)₂ | $H_2O$ |
| Zn(OAc)₂ | $H_2O$ |
| ZnCl₂ | $O_2$ |
| ZnEt₂ | $H_2O$ |
| ZnEt₂ | $H_2O$ photo assisted |
| ZnEt₂ | $O_2$ |
| ZnEt₂ | $O_3$ |
| ZnEt₂ | $O_2$ plasma |
| ZnEt₂ | $H_2O + NH_3 + O_2$ |
| ZnEt₂ | $N_2O$ |
| ZnEt₂ | $H_2O_2$ |
| ZnEt₂ | $H_2O$ plasma |
| ZnEt₂ | $H_2O + NH_3$ |
| ZnEt₂ | $N_2O$ plasma |
| ZnMe(O$^i$Pr) | $H_2O$ |
| ZnMe₂ | $H_2O$ |
| ZnMe₂ | $O_2$ plasma |

Where damp represents 4-dimethylamino-2-methyl-2-pentoxide, DMP represents (dimethylamino)propy, eeki represents [4-((2-ethoxyethyl)imino)-pent-2-en-2-olato], OAc represents acetate, Et represents ethyl, $^i$Pr represents isopropyl, and Me represents methyl.

Exemplary temperatures for steps 108 and/or 110 for various zinc halogen compounds are provided below in Table 2. Steps 108 and 110 can overlap or be coincident when a temperature is above the melting temperature of the meltable material. If a deposition temperature during step 108 is below the flow temperature, the temperatures below can be used during step 110.

TABLE 2

| Zn halogen | Temperature for step 108 and/or 110 |
|---|---|
| ZnF₂ | >870° C. |
| ZnCl₂ | 290-730° C. |
| ZnI₂ | >450° C. |
| ZnBr₂ | 400-700° C. |

In these cases, step 114 can include an oxidation process, such as a plasma process using an oxygen-containing gas (e.g., $O_2$ or the like) and/or an anneal in a water or $H_2O_2$ environment at a temperature of about 100 to about 1000° C. Initial cure temperature should generally be less than or equal to the temperature during step 110 as otherwise material will likely evaporate before treatment. Once partially converted, further curing can be done at higher temp.

Example 2: TaCl₅ Meltable Material

With reference to FIGS. 1, 2, and 7, during step 202, a convertible material layer 704 comprising tantalum can be formed overlying substrate 702. The depositing can be performed using, for example, PVD using a tantalum source. Step 204 can be performed using $Cl_2$ to convert tantalum to $TaCl_5$. A temperature within the reaction chamber during step 204 can be between 220 and 500 or about 220° C., which is above a melting temperature of $TaCl_5$. Step 114 can be performed using a nitrogen-containing gas (e.g., a mixture of $N_2$ and $H_2$) plasma process—e.g., using a remote, indirect, and/or direct plasma apparatus—to form $TaN_2$ as converted material 708.

Example 3: SeOCl₂ Meltable Material

With reference to FIGS. 1, 2, and 6, during step 108, a layer of meltable material 602 comprising $SeOCl_2$ is formed overlying substrate 602. The depositing can be performed using, for example, a (e.g., plasma) CVD process that includes providing $H_2Se$, $O_2$, and $Cl_2$ and/or activated species formed therefrom (e.g., from $Cl_2$ and/or $O_2$) to a reaction chamber. Step 108 can be performed at a temperature between 11 and 177° C. or about 50° C., which is above a melting temperature of $SeOCl_2$. Thus, steps 108 and 110 can be coincident and the meltable material can flow as it is deposited. Step 114 can be performed using an oxygen-containing gas plasma (e.g., $O_2$) plasma process—e.g., using a remote, indirect, and/or direct plasma apparatus—to form $SeO_2$ as converted material 606.

Example 4: ZnF₂ Meltable Material

With reference to FIG. 1, during step 108, a layer of meltable material comprising ZnF is formed overlying the substrate. The depositing can be performed using, for example, an ALD process that includes providing DEZ and HF to a reaction chamber. Step 108 can be performed at a temperature between 100 and 200° C. or about 150° C., which is below a melting temperature of $ZnF_2$. Step 110 can include heating the meltable material to, for example, a temperature of about 870 to about 1000 or about 900° C.—e.g., using an RTA process as described herein. In this example, step 114 can be omitted, such that the fill material comprises ZnF.

Example 5: Sn Halide Meltable Material

With reference to FIGS. 1, 2, and 4, during step 202, a convertible material layer 404 comprising tin oxide (SnO) can be formed overlying substrate 402. The depositing can be performed using, for example, ALD, CVD, PVD, or the like. Exemplary precursors and reactants are provided below in Table 3. Step 204 can be performed using HCl in a gas-phase reactor to convert the deposited ZnO to $ZnCl_2$. Step 110 can be performed at a temperature of about 290° C. to about 730° C. or at about 300° C. Step 114 can be performed using an oxygen plasma process—e.g., using an oxygen-containing reactant, such as $O_2$, $CO_2$, $N_2O$ and a remote, indirect, and/or direct plasma apparatus.

TABLE 3

| precursor | reactant |
|---|---|
| Sn(acac)₂ | $O_3$ |
| Sn(allyl)₄ | $O_2$ plasma |
| Sn(dmamp)₂ | $O_2$ plasma |
| Sn(dmamp)₂ | $O_3$ |
| Sn(dmamp)₂ | $H_2O$ plasma |
| Sn(DMP)₄ | $O_2$ plasma |

TABLE 3-continued

| precursor | reactant |
|---|---|
| Sn(edpa)$_2$ | O$_2$ plasma |
| Sn(NEtMe)$_4$ | O$_2$ plasma |
| Sn(NMe$_2$)$_4$ | H$_2$O$_2$ |
| Sn(NMe$_2$)$_4$ | O$_3$ |
| Sn(NMe$_2$)$_4$ | H$_2$O |
| Sn(NMe$_2$)$_4$ | O$_2$ plasma |
| Sn(OtBu)$_4$ | CH$_3$COOH |
| Sn(OtBu)$_4$ | O$_2$ plasma |
| Sn(tbba) | H$_2$O$_2$ |
| Sn($\eta_2$-((NtBu)CHMeCHMe(NtBu)))$_2$ | H$_2$O$_2$ |
| Sn($\eta_2$-((NtBu)CHMeCHMe(NtBu)))$_2$ | NO |
| Sn($\eta_2$-((NtBu)CMe$_2$CH$_2$(NtBu))) | O$_3$ |
| SnCl$_4$ | H$_2$O |
| SnCl$_4$ | H$_2$O$_2$ |
| SnCl$_4$ | O$_2$ plasma |
| SnEt$_4$ | N$_2$O$_4$ |
| SnEt$_4$ | O$_3$ |
| SnEt$_4$ | H$_2$O$_2$ |
| SnEt$_4$ | O$_2$ plasma |
| SnI$_4$ | O$_2$ |
| SnI$_4$ | H$_2$O$_2$ |
| SnMe$_4$ | N$_2$O$_4$ |
| SnMe$_4$ | H$_2$O plasma |
| SnnBu$_2$(CH$_3$COO)$_2$ | O$_2$ plasma |
| SnnBu$_3$(EtO) | O$_3$ |

Where acac represents acetylacetonate, dmamp represents dimethylamino-2methyl-2butoxy, DMP represents (dimethylamino)propy, edpa represents N-ethoxy-2,2-dimethyl propanamido, Et represents ethyl, Me represents methyl, tBu represents tertbutyl, tbba refers to tert-butyl-butane-2,3-diamido, and Bu represents butyl.

Step 204 can include a plasma or thermal process using one or more halogens. Table 4 provides exemplary halogen compounds and treatment processes suitable for step 204 in accordance with this example.

TABLE 4

| Sn halo compound | Halogenization process |
|---|---|
| SnF$_4$ | NF$_3$, SF$_6$ remote/direct plasma |
| SnCl$_4$ | Cl$_2$, BCl$_3$ remote/direct plasma |
| SnBr$_4$ | HBr, remote/direct plasma |
| SnI$_4$ | BI$_3$ remote/direct plasma |

Table 5 provides exemplary temperatures for step 110 for various tin compounds in accordance with this example.

TABLE 5

| Sn halo compound | Temperature during step 110 |
|---|---|
| SnF$_4$ | >700° C. |
| SnCl$_4$ | Step 110 overlaps with step 108 |
| SnBr$_4$ | Step 110 overlaps with step 108 |
| SnI$_4$ | 150-300° C. |

In these cases, step 114 can include a plasma process using an oxygen-containing gas (e.g., O$_2$, H$_2$O, H$_2$O$_2$, CO$_2$, N$_2$O) and/or a heated environment or an anneal in a water or H$_2$O$_2$ environment at a temperature of about 100 to about 1000° C. Again, an initial cure temperature should be less than or equal to a temperature during step 110, as otherwise material will likely evaporate before treatment. Once partially converted, further curing can be done at higher temp. A temperature ramp may be desirable for an anneal.

Example 6: Metal Layer of Meltable Material

During step 108, a metal mixture (e.g., an alloy) of two or more metals or a laminate comprising two or more metal-containing layers (e.g., formed according to process 300) (both generally referred to as a metal mixture) is formed overlaying a substrate. The metal mixture can have, averaged as a whole, a composition that is at or around a eutectic point of the material system in question. For example, the composition of each element in the mixture can be ±10, ±5, or ±1 percent of the respective composition of the element at the eutectic point for the metal mixture and/or a melting temperature of the metal mixture can be within ±10, ±5, or ±1° C. of the eutectic temperature of a mixture comprising or consisting of the elements (referred to as eutectic material).

During step 110, the metal mixture or laminate is heated to a temperature above the melting temperature of the metal mixture—e.g., above a eutectic point of the metal mixture.

FIGS. 1 and 8 illustrate an exemplary process suitable for a metal mixture (e.g., laminate or alloy). During step 102, a substrate 802 is provided. Substrate 802 can include a wettable liner and/or a pretreated surface as described herein. A layer of meltable material, i.e., a layer of a metal mixture 804, is deposited during step 108. As noted above, layer 804 can be deposited using any suitable deposition process, such as PVD, ALD, CVD, plasma-enhanced process, or the like. In the case of laminates, two or more layers of materials with differing compositions are deposited. In accordance with examples of these embodiments, at least one metal is different in two or more of the laminate layers.

Any suitable heating technique, such as the heating techniques described above, can be used for step 110. By way of example, RTA may be particularly useful.

As noted above, method 100 can include formation of a wettable liner. Exemplary suitable wettable liners for use with metal mixtures include other metals, semiconductors (such as Si, Ge, SiC), and metal (e.g., transition metal) carbides, nitrides, and/or borides.

With reference again to FIG. 9, fill material 906 can comprise a metal mixture—e.g., formed in accordance with this example. In these cases, structure 900 is suitable for use for, for example, work function metals, via fill applications, and metal deposition in damascene processes (with reduced overburden).

Below are some specific examples of meltable material and the corresponding melting and flow temperatures suitable for use in accordance with this example.

TABLE 6

| Meltable Material | Melting Temperature (° C.) | Step 110 Temperature (° C.) |
|---|---|---|
| Sn—Ag—Cu material (e.g., 95 wt. % Sn, 4 Wt % Ag & 1 wt. % Cu) | 218 | 220-230 or 225 |
| Sn | 232 | 235-245 or 240 |
| Al—Cu material (e.g., 35 wt. % Cu and 65 wt. % Al) | 548 | 550-570 or 560 |
| Al$_2$O$_3$—Na$_3$AlF$_6$ (e.g., 47 wt. % Al$_2$O$_3$; 53 wt. % Na$_3$AlF$_6$) | 695 | 700-720 or 700 |

It is noted that, in the case of metal mixtures, method 100 may not include post treatment step 114.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of forming material within a gap on a surface of a substrate, the method comprising the steps of:
   providing the substrate within a reaction chamber of a reactor, the substrate comprising a gap and a surface material within the gap;
   forming a layer of meltable material comprising meltable material overlying the substrate;
   heating the meltable material to a flow temperature, wherein the flow temperature is higher than a melting temperature of the meltable material, to form molten material, wherein the molten material flows within the gap; and
   cooling the molten material to below the melting temperature to form fill material within the gap,
   wherein the meltable material is a dielectric material or a semiconductor, wherein the step of forming the layer of meltable material comprises:
      forming a convertible material layer on a surface of the substrate, wherein the convertible material layer comprises one or more of a metal oxide, silicon, germanium, or a compound semiconductor; and
      providing one or more of a halogen reactant and an oxyhalogen reactant to thereby form one or more of a halogenated material and an oxyhalogenated material on the surface.

2. The method of claim 1, wherein the meltable material is not polymeric material.

3. The method of claim 1, wherein the step of forming the layer of meltable material comprises a cyclical deposition process.

4. The method of claim 1, wherein the step of forming the layer of meltable material comprises a conformal deposition process.

5. The method of claim 1, wherein the meltable material is a semiconductor comprising one or more of a compound semiconductor comprising an alloy of two elemental semiconductors, an elemental semiconductor, a compound semiconductor comprising a chalcogenide, silicon carbide, Group II-VI semiconductor materials, Group III-V semiconductor materials, a metal carbide, a metal boride, or a metal nitride.

6. The method of claim 1, wherein one or more of the halogen reactant and the oxyhalogen reactant comprises activated species.

7. The method of claim 1, wherein providing one or more of the halogen reactant and the oxyhalogen reactant comprises one or more of HCl, HBr, $OF_2$, $FClO_2$, and $FClO_3$.

8. The method of claim 1, wherein the surface material comprises dielectric material.

9. The method of claim 1, wherein the steps of forming the layer of meltable material and heating the meltable material overlap.

10. The method of claim 1, wherein the steps of forming the layer of meltable material and heating the meltable material overlap.

11. The method of claim 1, wherein the step of forming the layer of meltable material comprises forming a layer comprising a semiconductor.

12. The method of claim 1, further comprising a step of exposing the fill material to a reactant to form a converted material within the gap.

13. The method of claim 1, wherein the step of forming the layer of meltable material comprises depositing one or more layers.

14. The method of claim 13, wherein the meltable material comprises eutectic material.

15. The method of claim 13, wherein the meltable material comprises a semiconductor.

16. The method of claim 13, wherein the meltable material comprises a compound semiconductor.

17. The method of claim 1, further comprising a step of forming a wettable liner on the surface material prior to the step of forming the layer of meltable material.

18. The method of claim 17, wherein the wettable liner comprises a semiconductor or a dielectric material.

19. The method of claim 1, further comprising a step of pretreating the surface material prior to the step of forming the layer of meltable material.

20. The method of claim 1, wherein the steps of forming the layer of meltable material and heating the meltable material are performed in the same reactor system.

* * * * *